(12) United States Patent
Kaufman-Osborn et al.

(10) Patent No.: US 9,818,599 B2
(45) Date of Patent: Nov. 14, 2017

(54) METHOD FOR IN-SITU DRY CLEANING, PASSIVATION AND FUNCTIONALIZATION OF SI—GE SEMICONDUCTOR SURFACES

(71) Applicant: The Regents of the University of California, Oakland, CA (US)

(72) Inventors: Tobin Kaufman-Osborn, San Diego, CA (US); Andrew C. Kummel, San Diego, CA (US); Kiarash Kiantaj, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 953 days.

(21) Appl. No.: 14/062,136

(22) Filed: Oct. 24, 2013

(65) Prior Publication Data

US 2014/0109930 A1    Apr. 24, 2014

Related U.S. Application Data

(60) Provisional application No. 61/717,749, filed on Oct. 24, 2012.

(51) Int. Cl.
*H01L 21/02* (2006.01)
*H01L 21/302* (2006.01)
*H01L 21/28* (2006.01)

(52) U.S. Cl.
CPC ...... *H01L 21/0206* (2013.01); *H01L 21/0228* (2013.01); *H01L 21/02046* (2013.01);
(Continued)

(58) Field of Classification Search
None
See application file for complete search history.

(56) References Cited

U.S. PATENT DOCUMENTS

2005/0148162 A1* 7/2005 Chen .................. C30B 25/02
                                                      438/503
2006/0014363 A1* 1/2006 Daval .............. H01L 21/76254
                                                      438/455

OTHER PUBLICATIONS

Anthony. B., et al., "In situ Cleaning of Silicon Substrate Surfaces by Remote Plasma-Excited Hydrogen", J. Vac. Sci. Technol. B, vol. 7 (4), (Jul. 1989), pp. 621-626.
(Continued)

*Primary Examiner* — Michelle Mandala
(74) *Attorney, Agent, or Firm* — Steven P. Fallon; Greer, Burns & Crain

(57) ABSTRACT

A method for in-situ dry cleaning of a SiGe semiconductor surface doses the SiGe surface with ex-situ wet HF in a clean ambient environment or in-situ dosing with gaseous $NH_4F$ to remove oxygen containing contaminants. Dosing the SiGe surface with atomic H removes carbon containing contaminants. Low temperature annealing pulls the surface flat. Passivating the SiGe semiconductor surface with $H_2O_2$ vapor for a sufficient time and concentration forms an a oxygen monolayer(s) of —OH sites on the SiGe. Second annealing the SiGe semiconductor surface is conducted at a temperature below that which would induce dopant diffusion. A method for in-situ dry cleaning of a SiGe semiconductor surface, ex-situ degreases the Ge containing semiconductor surface and removes organic contaminants. The surface is then dosed with HF(aq) or NH4F(g) generated via $NH_3$+NH or $NF_3$ with $H_2$ or $H_2O$ to remove oxygen containing contaminants. In-situ dosing of the SiGe surface with atomic H removes carbon containing contaminants.

16 Claims, 17 Drawing Sheets

(52) U.S. Cl.
CPC .. *H01L 21/02054* (2013.01); *H01L 21/02301* (2013.01); *H01L 21/02312* (2013.01); *H01L 21/28255* (2013.01); *H01L 21/302* (2013.01)

(56) References Cited

OTHER PUBLICATIONS

Jones, D. E., et al., "Scanning Tunneling Microscopy Study of Cleaning Procedures for SiGe(001) Surfaces," Surf. Sci, vol. 341, No. 1, (Nov. 1995), pp. 1005-1010.

Kaufman-Osborn, Tobin, et al., "Improving Nucleation and Passivation of Ge(100) via H2O and H2O2 Dosing", TechCon 2012, Sep. 10, 2012, 11 pages.

Kiantaj, Kiarash, et al., Presentation: "In-Situ Gas Phase Cleaning of Ge(100) surface", Semiconductor Research Corporation, TechCon 2012, Oct. 29, 2012, 10 pages.

Kiantaj, Kiarash, et al., "In-Situ Gas Phase Cleaning of Ge(100) surface", Semiconductor Research Corporation, TechCon 2012, Sep. 10-11, 2012, 4 pages.

Kinosky, D., et al., "Hydrogen Plasma Cleaning of the Si(100) Surface: Removal of Oxygen and Carbon and The Etching of Si," Mat. Res. Soc. Symp. Proc., vol. 315, (1993), pp. 219-224.

Li, P. W., et al., "SiGe Gate Oxide Prepared at Low Temperatures in an Electron Cyclotron Resonance Plasma," Appl. Phys. Lett., 63, (21), Nov. 22, 1993, pp. 2938-2940.

Lee, Joon Sung, et al., "Atomic Imaging of Nucleation of Trimethylaluminum on Clean and H2O Functionalized Ge (100) surfaces," Journal of Chemical Physics, 135, (2011), pp. 054705-1-054705-7.

Prabhakarana, K., et al., "An efficient Method for Cleaning Ge(100) Surface," Surface Science vol. 316, Issues 1-2, (1994), pp. L1031-L1033.

Tae, Heung Sik, et al., "Low-Temperature in situ Cleaning of Silicon (100) Surface by Electron Cyclotron Resonance Hydrogen Plasma," J. Vac. Sci. Technol. B, 13(3), (May/Jun. 1995), pp. 908-913.

Yang, H., et al., "Effective passivation of defects in Ge—rich SiGe-on-insulator substrates by Al2O3 deposition and subsequent post-annealing," Solid-State Electronics, vol. 60, (2011), pp. 128-133.

* cited by examiner

METHOD FOR IN-SITU DRY CLEANING, PASSIVATION AND FUNCTIONALIZATION OF SI—GE SEMICONDUCTOR SURFACES

PRIORITY CLAIM AND REFERENCE TO RELATED APPLICATION

The application claims priority under 35 U.S.C. §119 from prior provisional application Ser. No. 61/717,749, which was filed Oct. 24, 2012.

FIELD

A field of the invention is semiconductor fabrication. Example applications of the invention include processing of epitaxial Germanium (Ge) semiconductor surfaces, e.g., Ge containing wafers for atomic layer deposition. The invention is particularly applicable to SiGe.

BACKGROUND

Existing cleaning methods of the germanium surface involve wet chemical etching, ion bombardment, or very high temperature processing. The latter two processes are incompatible with commercial semiconductor logic processing. The wet cleaning method is extremely difficult to integrate into common process modules. The wet cleaning methods roughen the Ge surface leaving a surface that is disordered and/or left with contaminants. The disorder can be reduced by high temperature processing (875° C.), which is undesirable in commercial semiconductor processing because it induces dopant diffusion.

There are numerous previous reports of wet $H_2O_2$ cleaning and high dose H cleaning of Si, SiGe, and Ge. The Ge alloys (SiGe and GeSb) are important since they will likely be employed in commercial devices prior to pure Ge for channels, sources, and drains. Anthony et al. described that cleaning of silicon surfaces by remote RF hydrogen plasma in mTorr range after wet cleaning that can remove carbon and oxygen from the Si(100) surface. B. Anthony et al., "In situ Cleaning of Silicon Substrate Surfaces by Remote Plasma-Excited Hydrogen", J. Vac. Sci. Technol. B 7(4), (1989). A modification with wet cleaning and dosing with a remote H plasma source at an optimized Si sample temperature of 250° C. demonstrated both carbon and oxygen could be removed from Si(100) to produce a flat surface and a sharp RHEED pattern. D. Kinosky et al., "Hydrogen Plasma Cleaning of the Si(100) Surface: Removal of Oxygen and Carbon and The Etching of Si," Materials Research Society Proc 315, (1993). The need to avoid plasma damage is critical; Tae et al. developed a defect-free, in situ cleaning of wet cleaned silicon using an ECR UHV hydrogen plasma treatment at a 560° C. surface temperature; however, to avoid ion damage a positive voltage had to be applied to the sample. See, Tae, et al., "Low-Temperature in situ Cleaning of Silicon (100) Surface by Electron Cyclotron Resonance Hydrogen Plasma," J. Vac. Sci. Technol. B 13, 908 (1995).

For SiGe, similar results have been reported. Li et al. employed ECR atomic H cleaning with 20 eV ion energy after wet cleaning with $HCl:H_2O_2$ and HF to remove metallic and organic impurities from SiGe samples at 250° C., but it is unclear if oxygen was removed. Li et al., "SiGe Gate Oxide Prepared at Low Temperatures in an Electron Cyclotron Resonance Plasma," Appl. Phys. Lett. 63, 2938 (1993).

The worked described by Jones et al. is the only previous dry cleaning method known to the present inventors for a germanium containing semiconductor device. That process employed UV ozone and an extremely high temperature and long duration (>12 hr) anneal. See, D. E. Jones et al. "Scanning Tunneling Microscopy Study of Cleaning Procedures for SiGe(001) Surfaces," Surf. Sci Vol. 341, No. 1, pp. 1005-1010 (1995). The completely gas phase process produced a 1-2 nm oxide layer, but required extensive annealing up to 1050° C. for oxide desorption while maintenance of doping profiles in semiconductor requires processing below 500 C.

Others have reported that atomic hydrogen can be an effective way to remove oxygen and possibly carbon contamination from the Si/SiGe surfaces during cleaning, and the H does serve as a cleaning mechanism agent. Either high atomic H cleaning doses or wet cleans were employed, both of which induce etching Since there is a great interest in using Ge as channel material in FinFETs, any ex-situ acid wet cleaning or high atomic H dose procedure should be avoided to minimize etching and surface roughness. Prabhakarana, et al., "An efficient Method for Cleaning Ge(100) Surface," Surface Science Volume 316, Issues 1-2, 1 Sep. 1994, Pages L1031-L1033.

A known passivation method uses $H_2O$ gas phase dosing to passivate and functionalize an already cleaned surface. See, J. S. Lee, et. al., "Atomic Imaging of Nucleation of Trimethylaluminum on Clean and H2O Functionalized Ge(100) surfaces," Journal of Chemical Physics, 135, 054705, (2011). Other gas phase passivation methods include nitridation and oxidation. Nitridation of the Ge surface is typically performed using a plasma source to produce a thermally stable Ge oxynitride or Ge nitride layer in order to suppress the out-diffusion of GeO from the Ge surface into the high-k dielectric layer during the post-deposition annealing process. Oxidation using ozone or high pressure $O_2$ is also found to passivate the Ge surface by forming a stoichiometric $GeO_2$ layer, which minimizes the suboxide species at the interface. However, to scale down the equivalent oxide thickness (EOT) of the Ge-channel MOSFET device, the thickness of these passivation layers has to be reduced to about one monolayer (ML).

Others have reported passivation methods on the SiGe (100) surface including growth of a Si passivation layer. These methods can result in non-uniform growth unless very thick passivation layers are used. Yang et. al. reported on the passivation of the SiGe surface using an $Al_2O_3$ layer but the $Al_2O_3$ layer was very thick (20 nm), which would be bad for scaling of the equivalent oxide thickness (EOT) in MOSFETs, where passivation layers more than 1 nm are not acceptable. See, Yang et al., "Effective passivation of defects in Ge-rich SiGe-on-insulator substrates by $Al_2O_3$ deposition and subsequent post-annealing," Solid State Electronics, Volume 60, Issue 1, pp 128-133. The $Al_2O_3$ passivation resulted in $SiO_2$ film growth.

Thermal oxidation passivation methods of the SiGe surface lead to preferential oxidation of Si species. This produces Ge-rich layers near the SiGe-oxide interface, which is known to cause degradation of the oxide properties.

SUMMARY OF THE INVENTION

A preferred method for in-situ dry cleaning of a SiGe semiconductor surface doses the SiGe surface with ex-situ wet HF in a clean ambient environment or in-situ dosing with gaseous $NH_4F$ to remove oxygen containing contaminants. Dosing the SiGe surface with atomic H removes carbon containing contaminants. Low temperature annealing pulls the surface flat. Passivating the SiGe semiconductor surface with $H_2O_2$ vapor for a sufficient time and concentration forms an a oxygen monolayer(s) of —OH sites on the SiGe. Second annealing the SiGe semiconductor surface is conducted at a temperature below that which would induce dopant diffusion.

A preferred method for in-situ dry cleaning of a SiGe semiconductor surface, ex-situ degreases the Ge containing semiconductor surface and removes organic contaminants. The surface is then dosed with HF(aq) or NH4F(g) generated via $NH_3+NH$ or $NF_3$ with $H_2$ or $H_2O$ to remove oxygen containing contaminants. In-situ dosing of the SiGe surface with atomic H removes carbon containing contaminants.

DETAILED DESCRIPTION OF THE PREFERRED EMBODIMENTS

Figure 1:
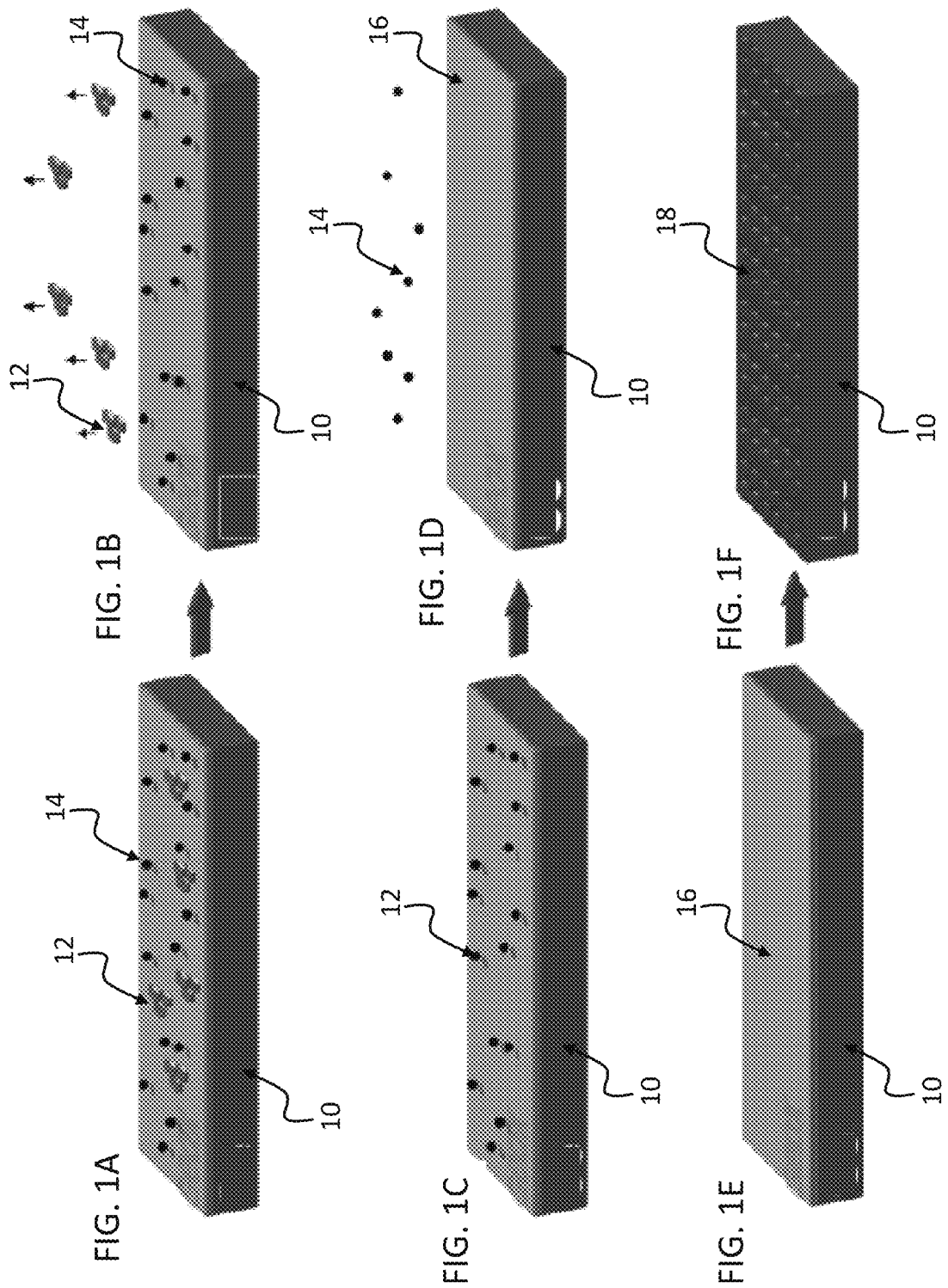
FIGS. 1A-1F illustrates a preferred embodiment method for in-situ cleaning, passivation and functionlization of Ge containing surfaces.

An embodiment of the invention is method for in-situ dry cleaning of a SiGe semiconductor surface doses the SiGe surface with ex-situ wet HF in a clean ambient environment or in-situ dosing with gaseous $NH_4F$ to remove oxygen containing contaminants. Dosing the SiGe surface with atomic H removes carbon containing contaminants. Low temperature annealing pulls the surface flat. Passivating the SiGe semiconductor surface with $H_2O_2$ vapor for a sufficient time and concentration forms an a oxygen monolayer(s) of —OH sites on the SiGe. Second annealing the SiGe semiconductor surface is conducted at a temperature below that which would induce dopant diffusion.

An embodiment of the invention is a method for in-situ dry cleaning of a SiGe semiconductor surface, ex-situ degreases the Ge containing semiconductor surface and removes organic contaminants. The surface is then dosed with HF(aq) or NH4F(g) generated via $NH_3+NH$ or $NF_3$ with $H_2$ or $H_2O$ to remove oxygen containing contaminants. In-situ dosing of the SiGe surface with atomic H removes carbon containing contaminants.

An embodiment of the invention is a method for cleaning epitaxial Ge containing semiconductor surfaces. The method is generally applicable to germanium containing semiconductors including Ge and GeSn, but excluding SiGe. Ge containing semiconductor wafer can be more challenging to clean than Si since carbon segregates to the surface of Ge containing wafer. The method uses high concentration $H_2O_2$ vapor in a non-disruptive process to clean wafers in a completely in-situ manner. By exposing an untreated wafer to high concentration $H_2O_2$(g), followed by a high-temperature anneal, the method cleans the Ge semiconductor wafer leaving an ordered and flat surface. An anneal in the present invention is preferably 550° C. or below and can be, for example, only at 500° C., and with atomic H can reduced to ~200° C. The method produces a clean, ordered, flat Ge containing semiconductor surface (excluding SiGe) ready for atomic layer deposition and CMOS processing. In preferred embodiments, a Ge containing wafer is first degreased and treated with an organic solvent, e.g., acetone, methanol; the wafer is placed in the vacuum chamber, and is treated with $H_2O_2$ vapor, preferably in a high concentration (e.g., 4-5% $H_2O_2$(g) in $H_2O$(g)). Annealing is then conducted at a temperature less than a temperature that would induce dopant diffusion, e.g., 550° C. or less, and preferably about ~250° C. Temperatures for source or drain material application annealing are preferably no more than ~550° C., while temperatures for channel material application are preferably no more than ~350° C.

Present methods demonstrate improvement over the only method known to the inventors to achieve high density monolayer passivation/functionalization of a Ge surface. While the belief is not dispositive or necessary to distinguish the present invention from the art, it is believed that the method is the first demonstration of the effect of $H_2O_2$(g) functionalization on nucleation of TMA (trimethylaluminum) on the Ge surface. The present methods provide atomically ordered Ge surfaces without requiring ex-situ acid cleaning procedures or in-situ ion sputtering treatments.

This invention also provides monolayer functionalization, passivation, and nucleation of gate oxide and tunneling oxides on Ge and SiGe surfaces for atomic layer deposition (ALD) of dielectrics.

The cleaning can be employed either for deposition of gate oxide or for cleaning the source and drains. The cleaning procedure includes: dosing with high concentration gas phase $H_2O_2$ to remove carbon and annealing or thermal atomic H exposure to remove the oxide formed by the $H_2O_2(g)$. The invention provides an all dry moderate temperature ~550° C. or less process for cleaning Ge wafers.

When forming a source/drain material, preferred embodiments limit the annealing temperature to a maximum of ~550° C. For formation of channel material, in preferred embodiments the annealing limit is a maximum of ~350° C. with atomic hydrogen use during the annealing to assist in the oxide removal. A temperature range during annealing with atomic hydrogen is in the range of ~200° C.-350° C. After $H_2O_2(g)$ dosing and annealing, the clean surface is ready for passivation, functionalization, and nucleation of atomic layer deposition. After low concentration $H_2O_2(g)$ dosing, the annealing should be held to below 100° C. and then after TMA dosing onto the $H_2O_2$ dosed surface, annealing is preferably conducted between 200-300° C.

In a preferred embodiment, ex-situ wet dipping in HF followed by in-situ atomic H dosing is used to effectively clean SiGe wafers if the surface is kept in an inert atmosphere between the ex-situ wet treatment and in-situ atomic H treatment. The ex-situ HF clean will effectively remove all oxygen containing contaminants from the surface while the in-situ atomic H treatment will effectively remove all carbon containing contaminants. Another preferred embodiment provides a method for a completely in-situ treatment and uses $NH_4F$ to effectively clean SiGe wafers. In-situ dosing of $NH_4F$ will effectively remove carbon and oxygen containing species ($SiO_x$ and $GeO_x$) from the surface. The $NH_4F$ can be dosed via in-situ formation via $NF_3$+atomic H, thermally mixing $NH_3$+$NF_3$, or plasma mixing of $NF_3$ with $H_2$ or $H_2O$.

Dielectric deposition is required for gate oxides but can also be used in methods of the invention for unpinning the contacts to sources and drains on Ge and Ge alloy based devices. For example, for gate oxides, in order to scale the equivalent oxide thickness (EOT) of a Ge(100) CMOS while maintaining a high mobility, a monolayer passivation and nucleation layer is needed whose formation does not disrupt the substrate. An example preferred monolayer passivation and nucleation scheme is saturation of Ge(100) with a monolayer of $H_2O_2$ at 300K, followed by a 100° C. anneal to form a layer with a high density of Ge—OH bonds, followed by saturation with TMA at 300K, and followed by a 200° C. anneal, which can readily be performed in an ALD (atomic layer deposition) reactor. A similar procedure can be used for oxide deposition on the source and drain. The procedure can be used for other crystal faces including SiGe(110) which has slightly different bonding. Saturation of Ge(100) with a monolayer of $H_2O_2$ chemisorbates at 300K forms a high density of Ge—OH bonds. This is followed by a 100° C. anneal which electrically unpins the surface. Subsequently, a saturation dose of TMA on the $H_2O_2$/Ge surface at 25 C followed by a 200-300 C anneal forms a monolayer of thermally stable Al—O bonds. This can readily be performed in an ALD (atomic layer deposition) reactor. The procedure can also be used for other Ge containing semiconductors, including SiGe and GeSn. The procedure can also be used for other crystal faces including SiGe(110) and Ge(110). The SiGe(110) surface has importance in MOSFET development as new geometries are considered for these devices.

A preferred method for in-situ dry cleaning of a Ge containing semiconductor surface includes ex-situ degreasing of the semiconductor surface to remove of organic contaminants. In-situ, using high concentration $H_2O_2$ gas phase precursor, multiple monolayers of $GeO_x$ are formed to remove carbon contamination. In-situ, $GeO_x$ is removed by annealing at a moderate temperature to remove the oxide and leave an atomically flat surface. The moderate temperature is below the level that would induce dopant diffusion. Preferably, the high concentration gas phase precursors are 4-5% $H_2O_2(g)$ in $H_2O(g)$, and the annealing comprises annealing at ~550° C. or less for source and drain material application and below 350° C. with atomic H for channel material application.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIGS. 1A-1F illustrate a preferred method of the invention. The method is performed completely in-situ, and anneal temperatures are low enough to be conducted in standard semiconductor processing. In FIG. 1A, a substrate containing Ge is provided. The substrate can be, for example, a Ge(100) crystal. The method is applicable to other semiconductors, such as SiGe and GeSn, and also other crystal faces including Ge(110) and SiGe(110), but for Si containing semiconductors an in-situ dry $NH_4F$ or ex-situ wet HF in a clean atmosphere cleaning step must be included. A Ge containing substrate 10 will have organic contamination 12 and carbon contamination 14. Organic contamination 14 is removed in FIG. 1B, such as with a wet solvent and then the substrate 10 is placed vacuum in FIG. 1C. The organic cleaning in FIG. 1B is an organic ex-situ solvent cleaning that is used to remove organic contamination 12 from the surface prior to any in-situ treatment. A dry cleaning process is conducted in FIG. 1D. The dry cleaning process uses $H_2O_2$ or H to remove the carbon contamination 14 and leave a clean $GeO_x$ surface 16. In an example preferred process, hydrogen peroxide gas, $H_2O_2(g)$, is used to remove hydrocarbon contamination. By using $H_2O_2$ in the gas phase, extensive etching of the surface can be avoided. Annealing is conducted in FIG. 1E to remove $GeO_x$ and this produces a clean semiconductor surface 18 that is ready for further processing/device fabrication in FIG. 1F. Advantageously, an anneal can be performed in a moderate temperature range, below 550° C., which avoids the very high temperature, e.g., 875° C., processing for methods that include many wet cleaning processes for Ge semiconductor services. In a preferred embodiment, an anneal is conducted at only ~500° C. after $H_2O_2(g)$ dosing, and this successfully removes oxide and carbon and can be used to form source and drain materials. The anneal temperature is reduced to below ~350° C. with use of atomic H. Use of atomic H during the anneal can drastically reduce the anneal temperature to preferably ~200-300° C., for example. The surface in FIG. IF is functionalized and passivated via low concentration $H_2O_2$. It is reactive to ALD and has a monolayer with a Fermi level that is unpinned after a 100° C. anneal. The surface is left with terminated with at least oxygen species (—OH or —O) per surface atom, which doubles the number of potential reactive sites compared to conventional passivation and ALD functionalization methods ($H_2O$ gas dosing).

Experiments have shown that when the $H_2O_2(g)$ dosed surface is initially annealed to 100° C., the bonding configuration on the surface changes resulting in unpinned Fermi level. After dosing with TMA, an anneal of ~200-300° C. is conducted. The $H_2O_2(g)$ functionalized surface is stable at 100° C. after $H_2O_2(g)$ dosing and 300° C. after TMA dosing on $H_2O_2$/Ge surface. A combination of complete monolayer $H_2O_2$ functionalization followed by TMA reaction provides a thermally stable Al—O bond, which provides a high density nucleation template for further high-k oxide deposition.

Experiments

Experiments were carried out in a UHV chamber with a base pressure of $2\times10^{-10}$ Torr. N-type Ge(100) samples were sonicated three times in high purity acetone, methanol and high performance liquid chromatography (HPLC) water to degrease the samples. Subsequently, the samples were blown dry with $N_2(g)$. After loading into the UHV chamber, samples were initially degassed by heating to 400° C. Afterwards, the samples were transferred to the ALD chamber with a base pressure of $2\times10^{-8}$ Torr. Samples were subsequently dosed with $H_2O_2(g)$ while the sample temperature was maintained at 300° C. Two different $H_2O_2(g)$ sources were used in experiments; a high concentration (4-5% $H_2O_2(g)$ in $H_2O(g)$) $H_2O_2$ vapor source from RASIRC® and a commercially available low concentration $H_2O_2$(2% $H_2O_2(g)$ in $H_2O(g)$). The high and low concentration gas sources still were both prepared from a 30% $H_2O_2/H_2O$ (liquid) solution. A vapor of this liquid solution which only has ~2% $H_2O_2(g)/H_2O(g)$ served as the low concentration vapor source and a higher concentration ~4-5% vapor served as the high concentration source when dosing.

All dosing lines and valves were made from Teflon. After dosing with $H_2O_2(g)$, samples were transferred to the UHV chamber for structural and chemical analysis. An anneal was employed to remove the oxide layer (but at relatively moderate temperatures compared to most wet processing techniques) and obtain large terraces on the surface. X-ray photoelectron spectroscopy (XPS) and scanning tunneling microscopy (STM) were used to analyze the chemical and structural configuration of the surface of Ge samples. In a separate experiment, Auger electron spectroscopy (AES) was used to quantify the amount of oxygen and carbon on the surface after treating the samples with thermal atomic hydrogen. Atomic hydrogen was produced using an Oxford Applied Research® TC50 thermal gas cracker. Atomic hydrogen was dosed at a pressure of $10^{-6}$ Torr.

Experiments showed that by using a high concentration (4-5%) gas phase $H_2O_2$ source, carbon contamination can be removed from Ge(100) without wet pretreatment. Gas phase $H_2O_2$ leaves a multilayer $GeO_x$ which can be desorbed from the surface by annealing. The $H_2O_2(g)$ forms about 4 ML of $GeO_x$ which readily desorbs from the surface at elevated temperature leaving an atomically ordered and clean surface.

Figure 2:
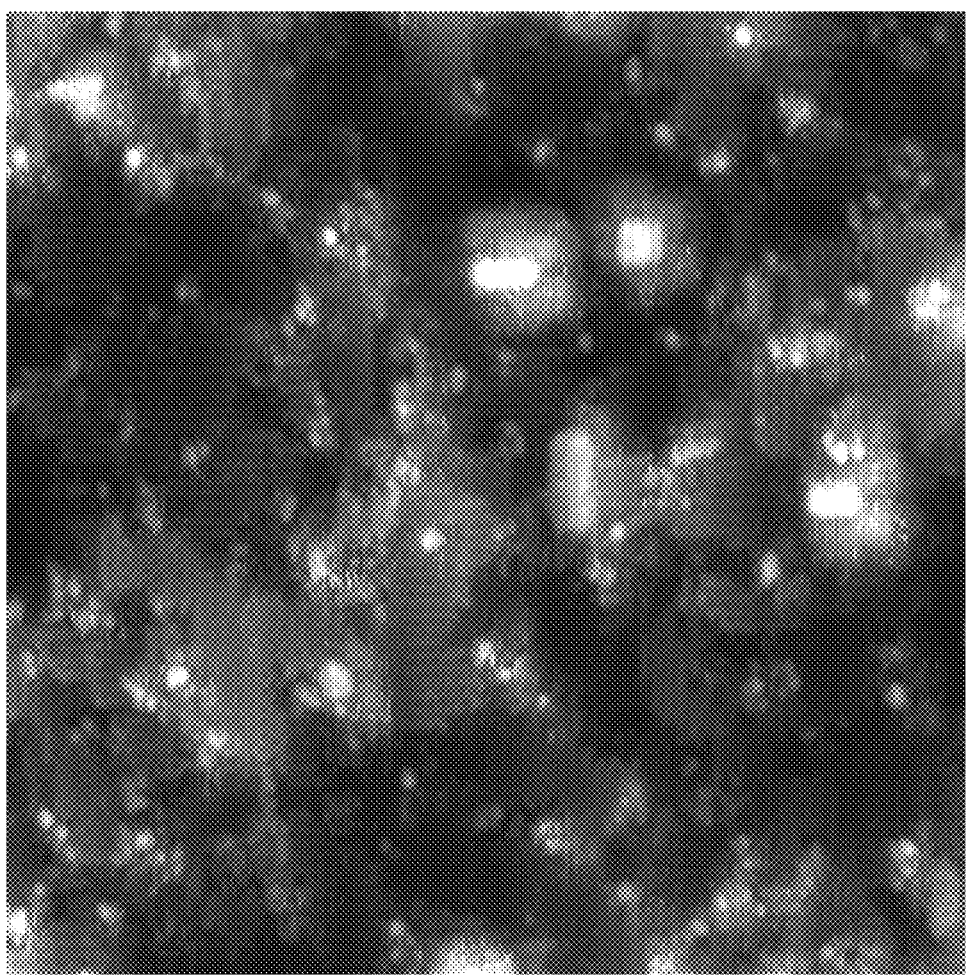
FIG. 2 is an image of an experimental N-type Ge(100) surface treated with high concentration $H_2O_2$ vapor at a sample temperature of 300° C. followed by a subsequent anneal at 750° C.

A Ge(100) surface was dosed with 60 MegaLangmuir of high concentration $H_2O_2(g)$ at a sample temperature of 300 C. The high concentration $H_2O_2$ source is built by RASIRC® and delivers a high ratio (4-5%) of vapor $H_2O_2/H_2O$. The source temperature is 40° C. while dosing. After forming multilayer $GeO_x$ on the Ge(100) surface, an anneal between 500-750° C. (the higher temperature was used in experiments to provide for better STM images) for 20 minutes removes the oxide layer leaving an ordered, flat, and contaminant free Ge surface as shown in FIG. 2. Bright white spots are in FIG. 2 are Ge adatoms.

Figure 3A:
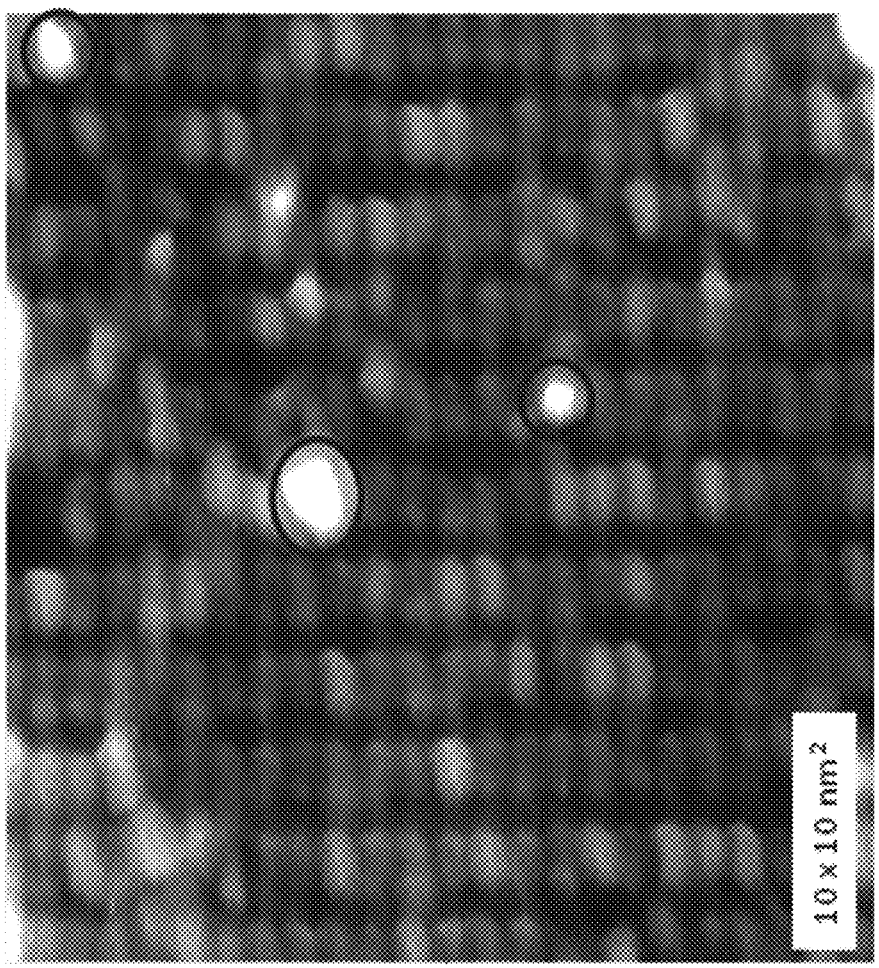
FIG. 3A is a filled state STM image of an experimental $H_2O_2$-dosed Ge(100) surface at RT (room temperature) showing that 0.95 ML (monolayer) of a Ge surface is covered by $H_2O_2$ chemisorption.
Figure 3B:
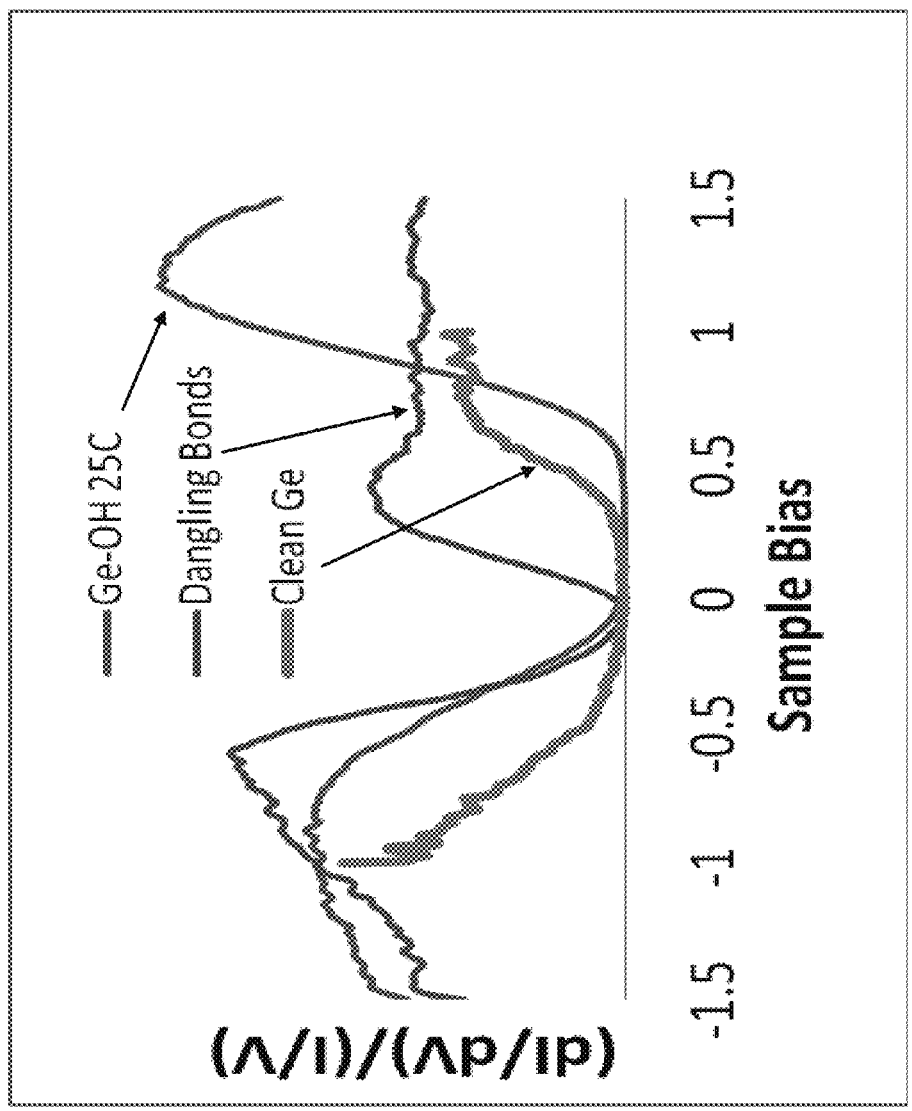
FIG. 3B is a plot showing conductance measurements obtained with STS (scanning tunneling spectroscopy) taken on various surface sites of the image of FIG. 3A.

Once a clean Ge surface is achieved, a saturation dose of low concentration $H_2O_2(g)$ is performed at below 100° C. to give a full monolayer of ~OH sites which terminates Ge dangling bonds. The saturation dose is self limiting, because no more adsorption occurs at saturation. The saturation dose provides the highest coverage that can be achieved. This passivation reduces the electronic density of states in the Ge band gap that occur when under coordinated Ge atoms exist on the surface. A Ge(100) surface dosed with $2.25\times10^6$ L of $H_2O_2(g)$ at 300K is shown in FIG. 3A. Nearly 100% of the surface is covered with $H_2O_2$ dissociative chemisorptions sites, with only a very few dangling bonds left unreacted. These few dangling bonds are circled. The density of states measured from these surface sites are compared in FIG. 3B. The data show that dangling bond sites have energy states near 0.5 eV, consistent with the presence of dangling bonds. The energy states around 0.5 eV on the $H_2O_2$ sites are significantly reduced, showing that the dangling bond states are passivated by the —OH bonds.

Figure 4A:
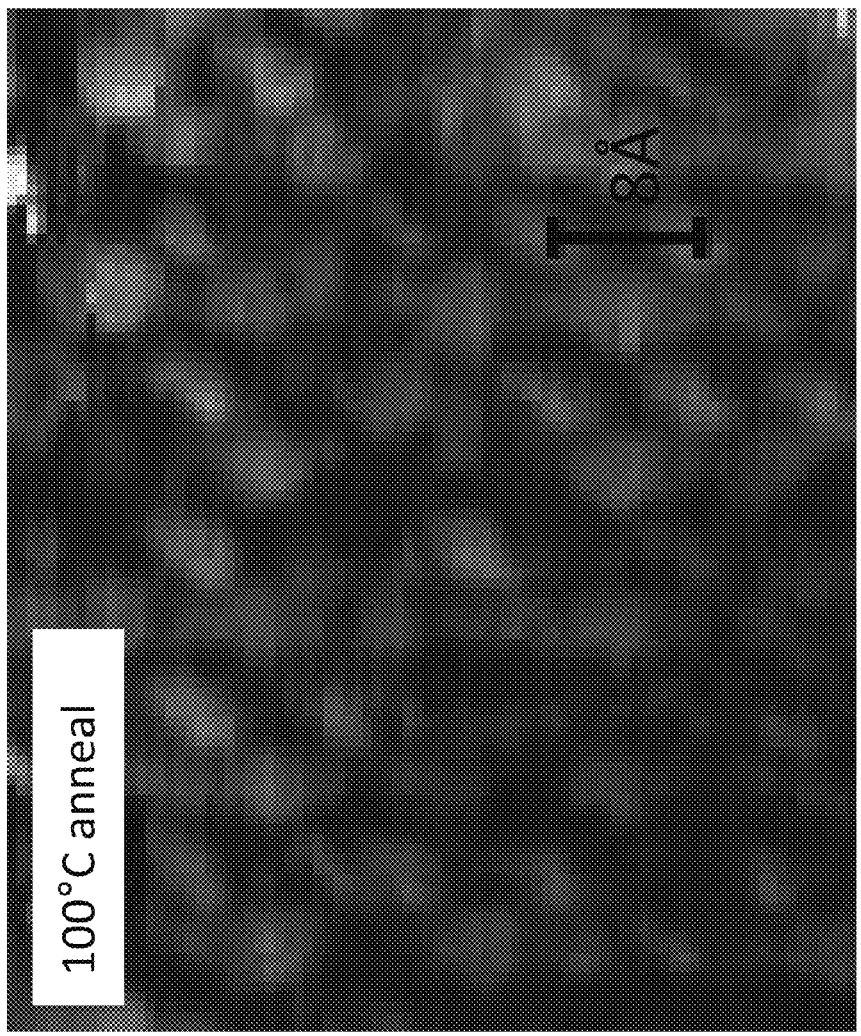
FIG. 4A is a filled state STM image of an experimental $H_2O_2$-dosed Ge(100) surface at RT annealed to 100° C. showing change in surface bonding configuration.
Figure 4B:
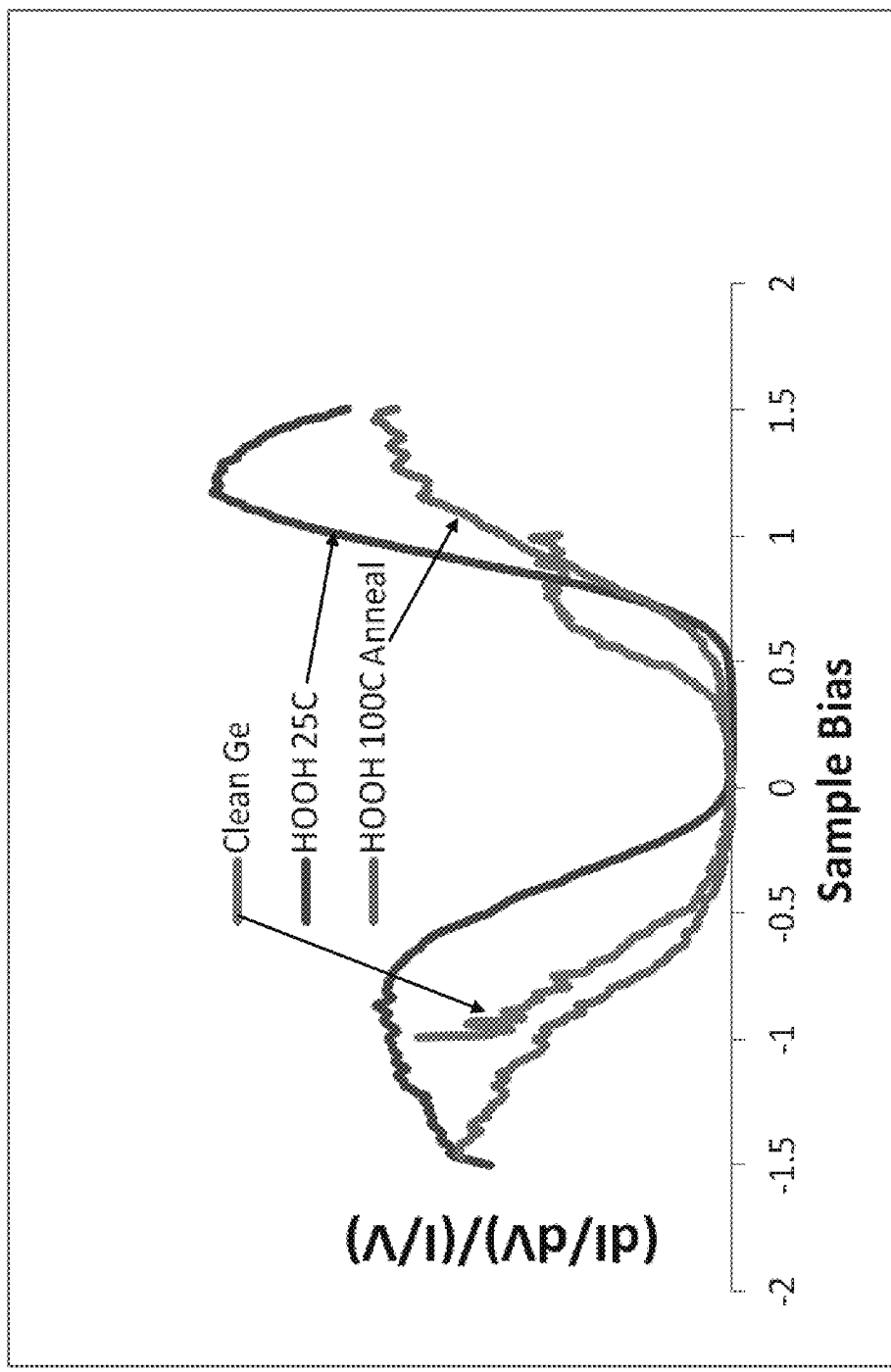
FIG. 4B is a plot showing conductance STS measurements taken on the annealed surface of FIG. 4A, which shows shift in Fermi level (0V sample bias)

When the Ge—OH surface is annealed to 100° C., the surface bonding configuration changes as shown in FIG. 4A. It is likely the initial dose could be at 100° C. instead of 25° C. also. The low temperature anneal reduces the large surface dipole, unpinning the surface and leaving an electronic structure similar to that of the clean surface. This shift in Fermi level is shown in FIG. 4B, which shows the density of states before and after the 100° C. anneal.

Figure 5A:
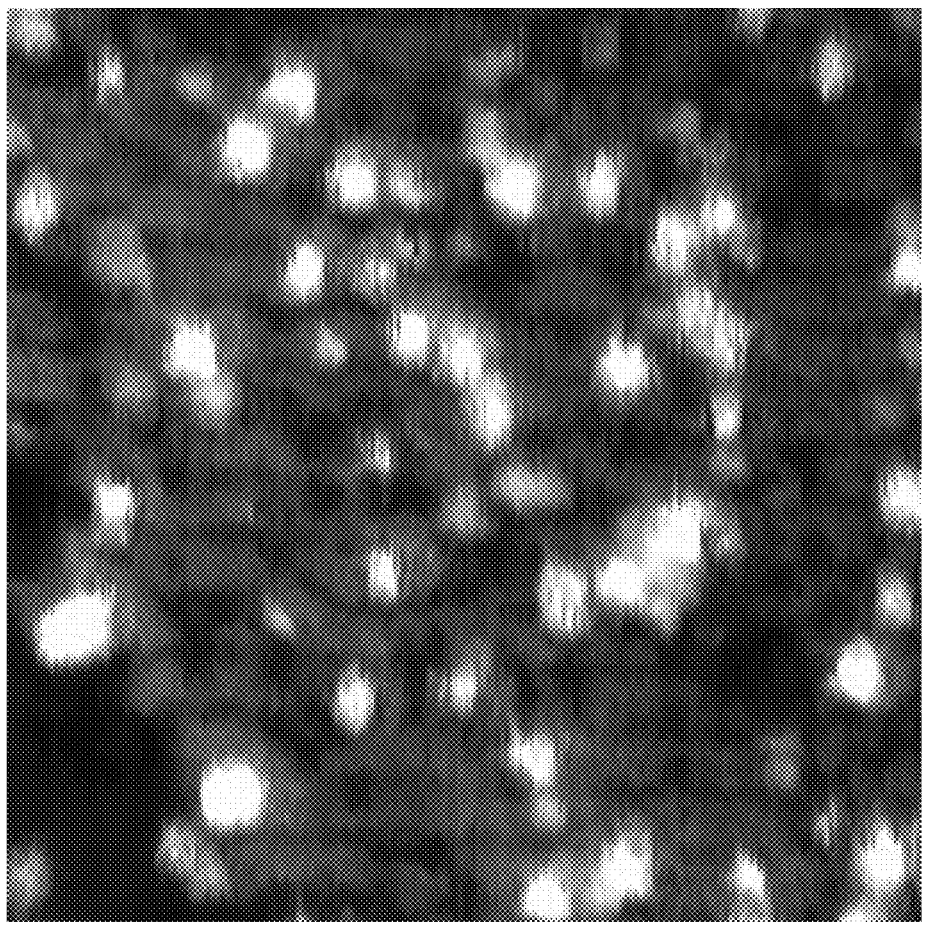
FIG. 5A is a filled state STM image of an experimental $TMA/H_2O_2$/Ge(100) surface dosed at RT annealed to 200° C. showing ordered structure formation (vertical rows)
Figure 5B:
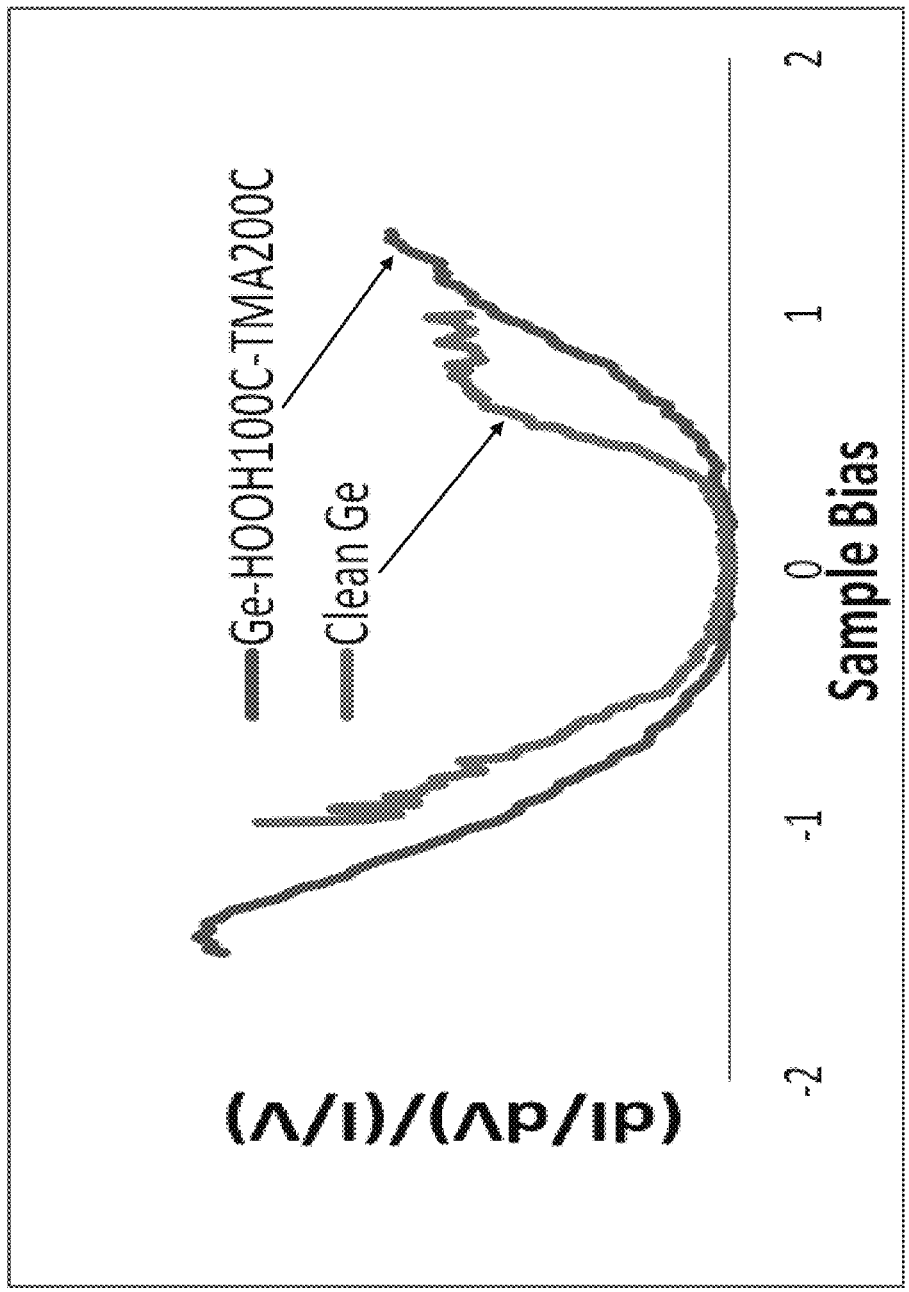
FIG. 5B is a plot showing conductance STS measurements taken on the experimental $TMA/H_2O_2$/Ge(100) surface annealed to 200° C. compared to clean Ge surface.

On the $H_2O_2(g)$ dosed Ge surface, a saturation dose of TMA is performed at 300K. TMA dissociatively chemisorbs to the oxygen on the surface Ge—OH forming Ge—O—Al bonds, while hydrogen atoms promotes a —$CH_3$ TMA ligand to desorb as $CH_4$. This leaves dimethylaluminum (DMA) and monomethyl aluminum (MMA) bonded to the surface via an Al—O bond. After the surface is annealed to 200° C., more methyl ligands desorb from the surface and an ordered structure forms on the surface as shown by the vertical rows that are apparent in FIG. 5A. The result is a near monolayer of ordered non-stoichiometric alumina that forms on the surface. TMA can also be dosed on the 100° C. annealed $H_2O_2$ dosed Ge surface. TMA will bond to the surface via a similar mechanism, and XPS data confirms that the nucleation density of TMA is equal on both the 25° C. as-dosed $H_2O_2$/Ge(100) surface and the 100° C. annealed $H_2O_2$/Ge(100) surface. Both result with an O to Al ratio of ~1. FIG. 5B shows the density of states of the TMA/100° C. annealed $H_2O_2(g)$/Ge surface demonstrating a slightly large bandgap than the clean surface and with no states in the bandgap. This demonstrates an excellent interface and template for further high-k oxide deposition because after a single monolayer of DMA or MMA is on the surface, a very high k dielectric can be deposited by ALD as shown by R. Suzuki. See, Suzuki et al. "1-nm-capacitance-equivalent-thickness HfO2/Al2O3/InGaAs metal-oxide-semiconductor structure with low interface trap density and low gate leakage current density" in Applied Physics Letters, 100, 132906 (2012).

The processing steps previously described for passivating and functionalizing the Ge(100) surface are very similar to the treatment needed to functionalize and passivate the SiGe(100) but note an additional $NH_4F$ cleaning step is required.

Figure 6A:
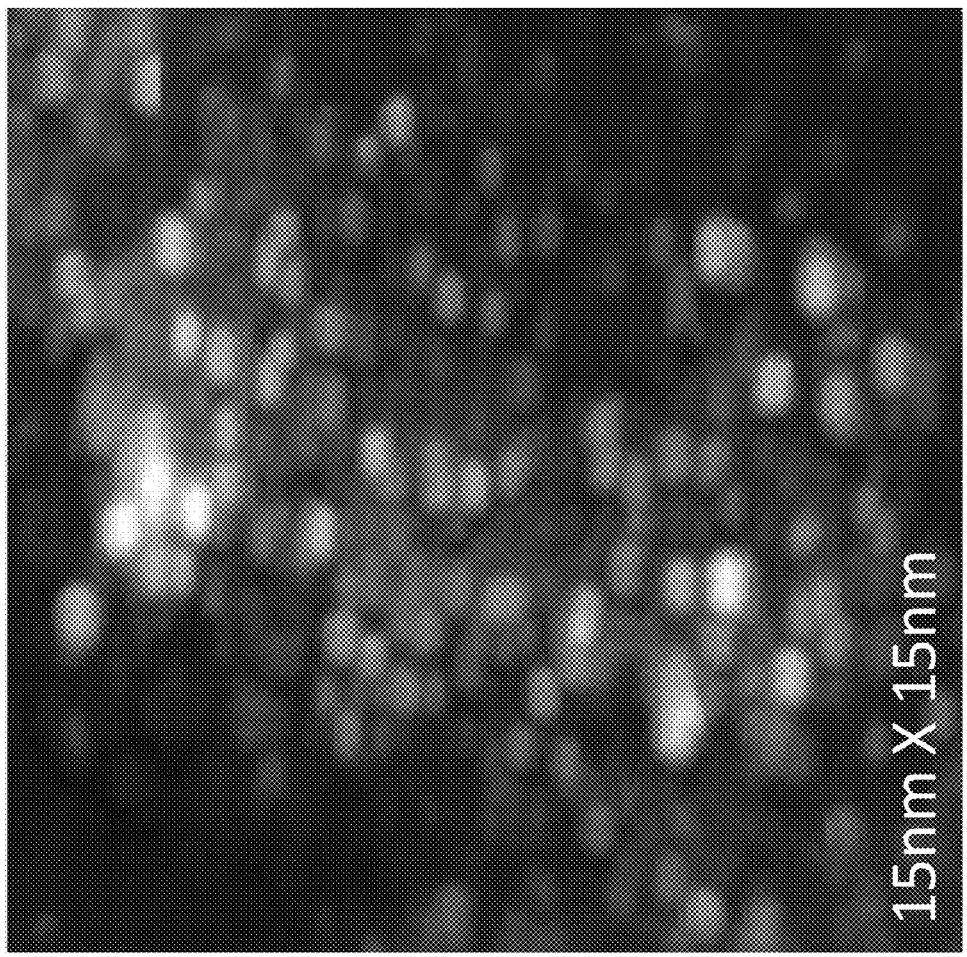
FIG. 6A is a filled state STM image of an experimental $H_2O_2$-dosed SiGe(100) surface at RT showing the SiGe (100) surface covered by $H_2O_2$ chemisorption.
Figure 6B:
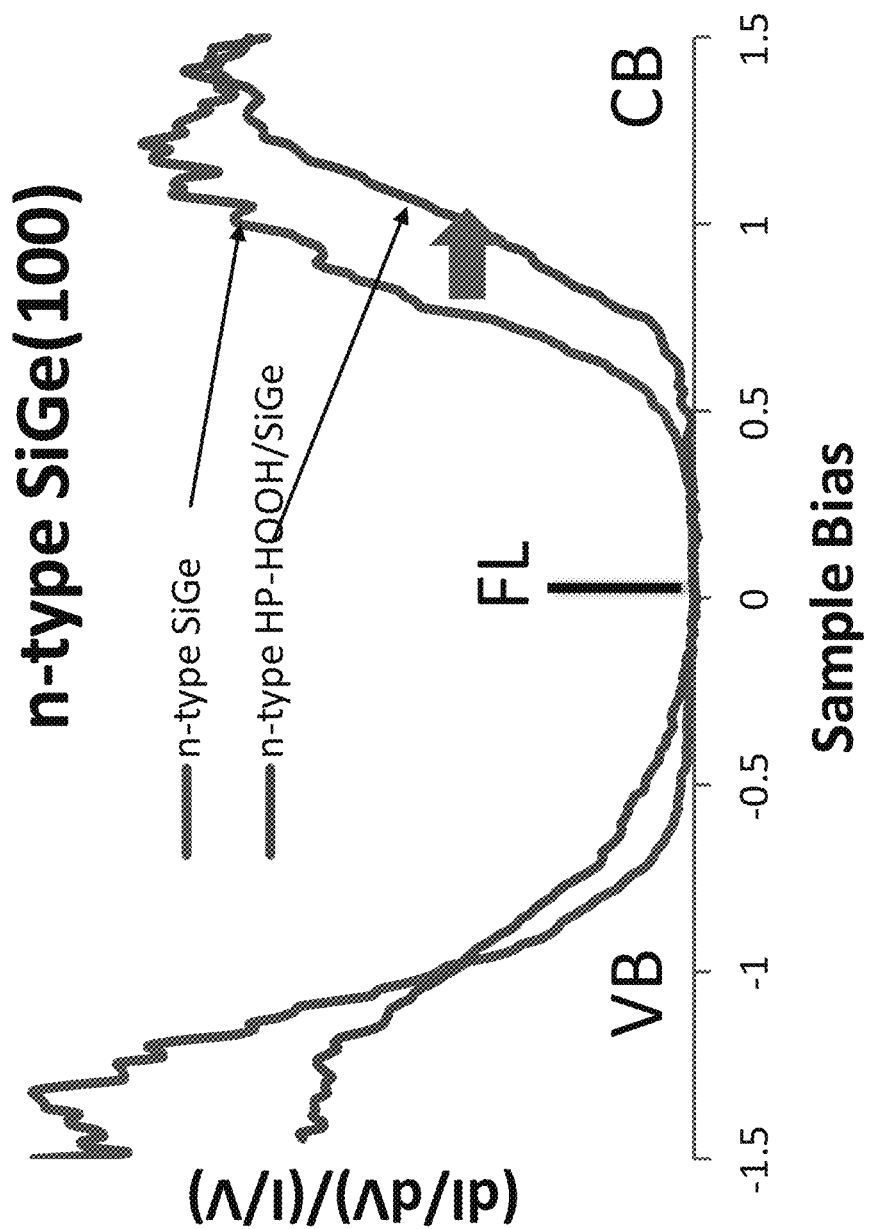
FIG. 6B is a plot showing STS taken on various surface sites of the clean SiGe surface and the $H_2O_2$/SiGe surface.

Once a clean SiGe(100) surface is achieved, a saturation dose of $H_2O_2(g)$ is performed at 300K to give a full monolayer of —OH sites which terminate SiGe dangling bonds. This passivation reduces the electronic density of states in the SiGe band gap caused by dangling bonds. The SiGe(100) surface dosed with $2\times10^4$ L of $H_2O_2(g)$ at 300K is shown in FIG. 6A. The density of states measured from this surface is shown and compared to the clean SiGe(100) surface in FIG. 6B. As expected, $H_2O_2(g)$ dosing (red curve) pins the Fermi level near the valence band edge due to the large surface dipole. The $H_2O_2(g)$ dosing also eliminates electronic states in the bandgap caused by dangling bonds on under coordinated atoms on the surface, which demonstrates successful passivation of the surface.

Figure 7A:
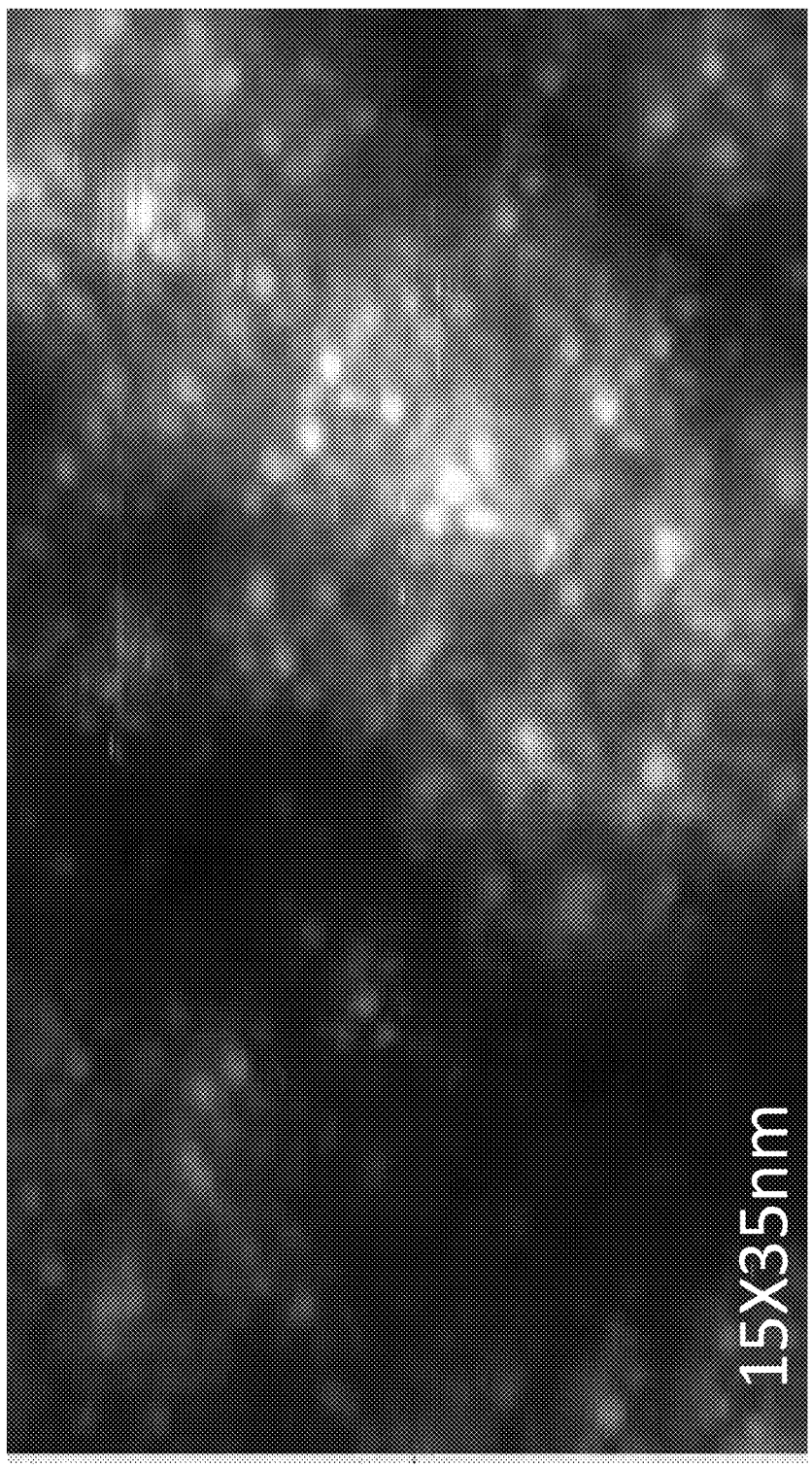
FIG. 7A is a filled state STM image of an experimental $H_2O_2$-dosed SiGe(100) surface at RT annealed to 290° C. showing change in surface bonding configuration.
Figure 7B:
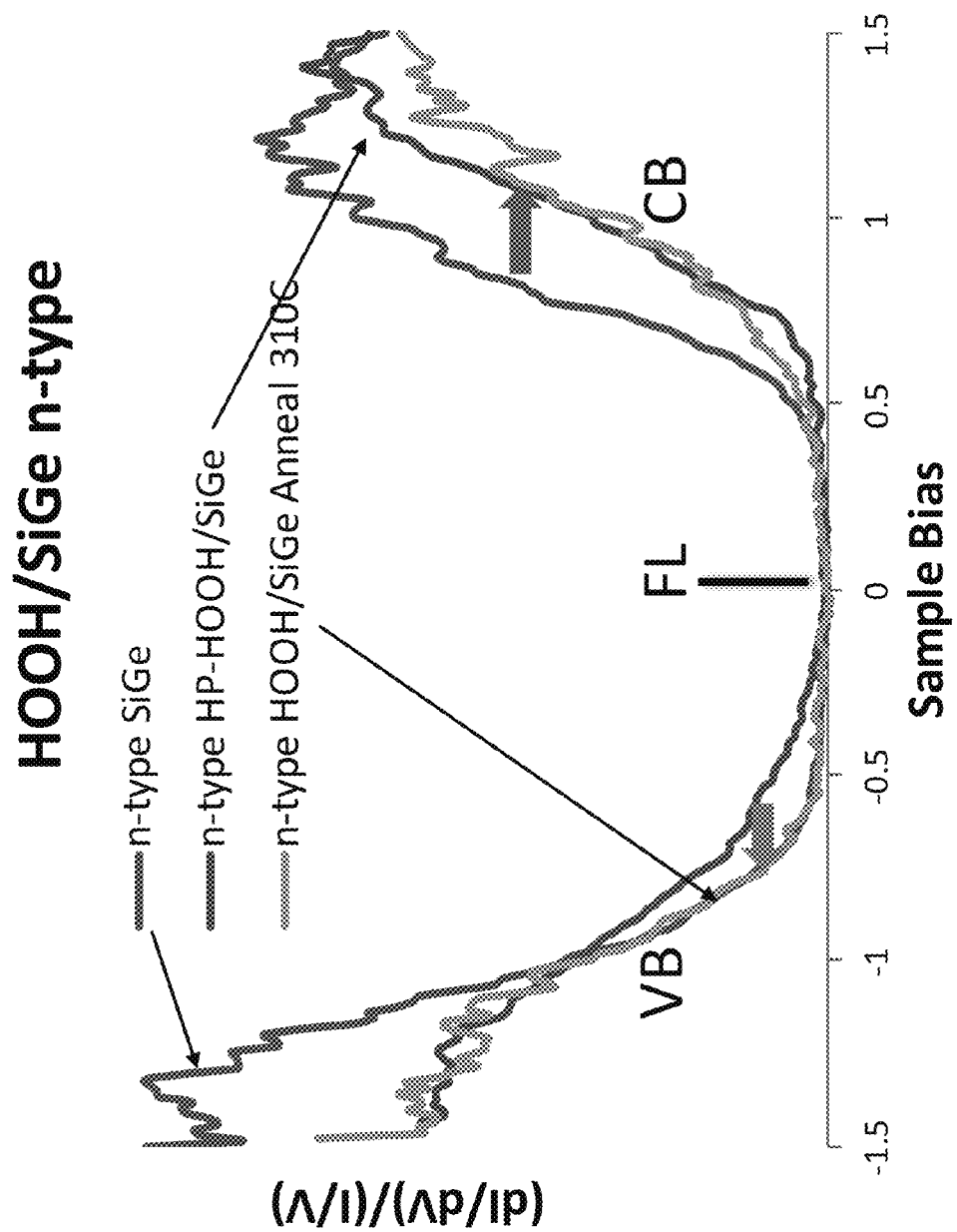
FIG. 7B is a plot showing conductance STS measurements taken from the annealed surface showing shift in Fermi level (0V sample bias)

When the SiGe—OH surface is annealed to 290° C., the surface bonding configuration changes, as shown in FIG. 7A. The large surface dipole is reduced, unpinning the surface and leaving an electronic structure similar to that of the clean surface. This shift in Fermi level is shown in FIG. 7B, which shows the density of states before and after the 290° C. anneal. The surface bonding configuration begins to change from the SiGe—OH surface at ~180° C., and anneals between 200-300° C. are preferred to provide the surface configuration change and reduce the surface dipole.

Figure 8A:
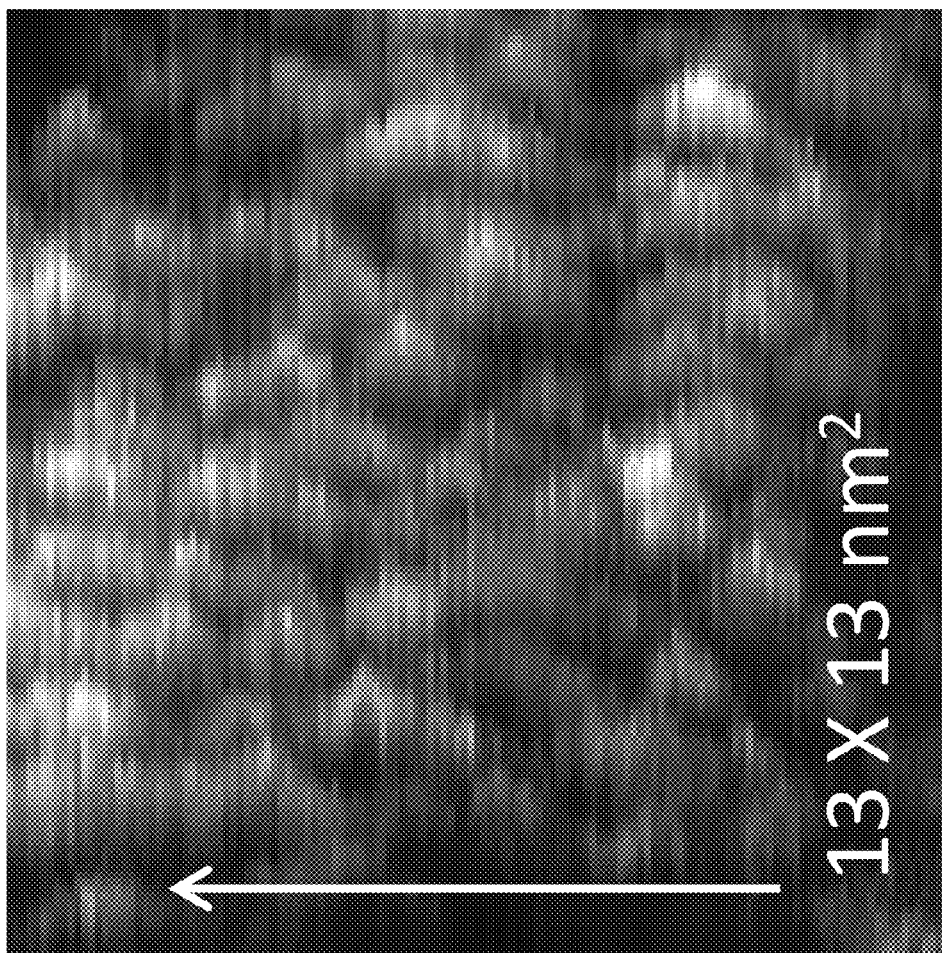
FIG. 8A is a filled state STM image of an experimental $TMA/H_2O_2$/SiGe(100) surface dosed at RT annealed to 240° C. showing ordered structure formation (vertical rows)
Figure 8B:
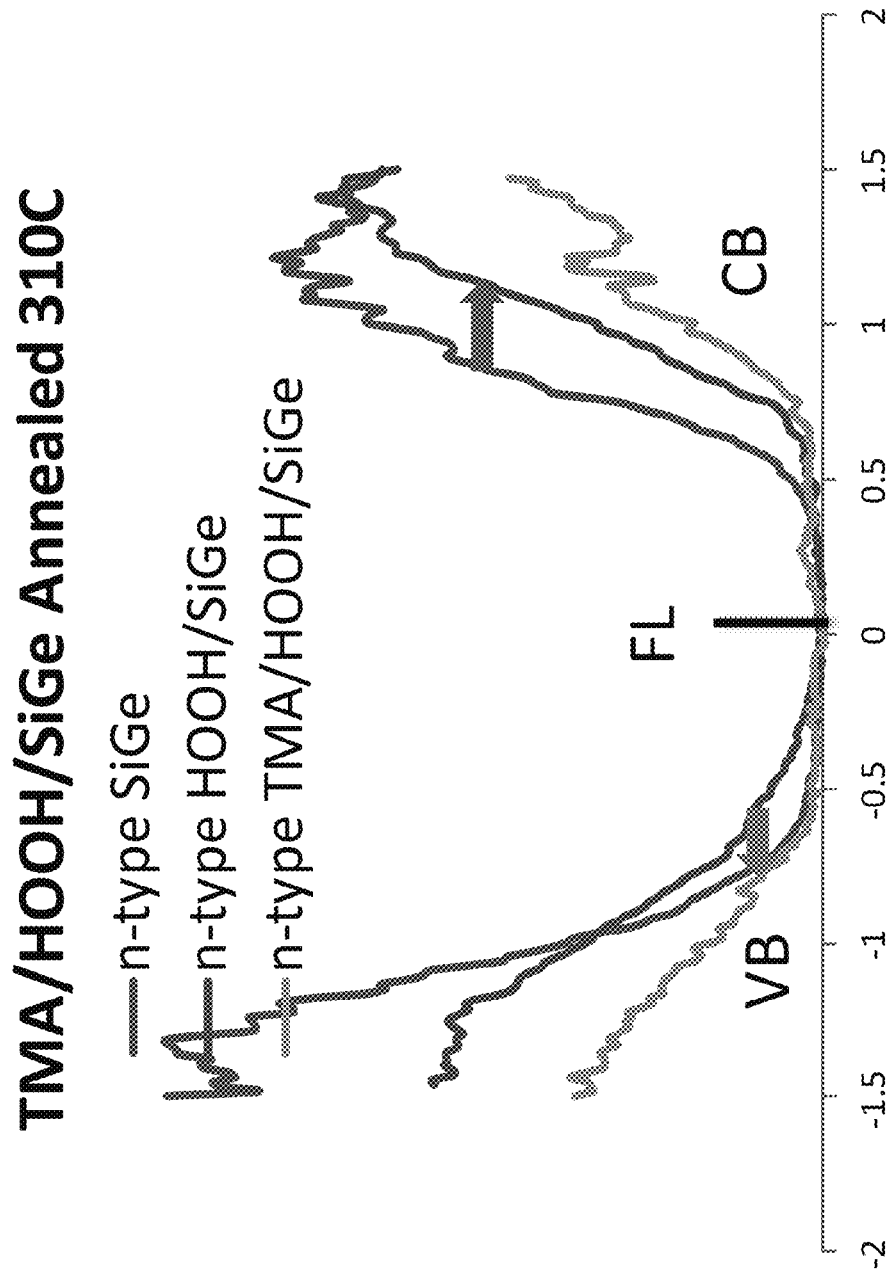
FIG. 8B is a plot showing conductance STS taken on the TMA/$H_2O_2$/SiGe(100) surface annealed to 310° C. and compared to clean SiGe and $H_2O_2$/SiGe surfaces.

On the $H_2O_2$(g) dosed SiGe surface, a saturation dose of TMA ($1\times10^5$ Langmuir) is performed at 300K. TMA dissociatively chemisorbs to the oxygen on the surface, while hydrogen atoms promotes a —$CH_3$ TMA ligand to desorb as $CH_4$. This leaves dimethylaluminum (DMA) bonded to the surface via an Al—O bond. After the surface is annealed to 200-300° C., more methyl ligands desorb from the surface and an ordered structure forms on the surface as shown by the vertical rows in FIG. 8A. The result is a near monolayer of ordered non-stoichiometric alumina which forms on the surface. TMA can also be dosed on the 290° C. annealed $H_2O_2$(g) dosed SiGe surface. TMA will bond to the surface via a similar mechanism as previously described. FIG. 8B shows the density of states of the TMA/$H_2O_2$/SiGe surface, which demonstrates a slightly large bandgap than the clean surface and with no states in the bandgap and an unpinned interface. Once the monolayer of TMA bonds to the surface, very high-k dielectrics such as $HfO_2$ can readily be deposited since they bond to Al—OH functional groups. This demonstrates a high quality interface and template for further high-k oxide deposition.

The SiGe(100) experiments provide strong evidence that the present ALD nucleation methods will work on the SiGe(110) surface. Others have shown that $H_2O$ functionalization of the Si(110) surface takes place in a dissociative manner, which was demonstrated on the Si/SiGe/Ge(100) surface. While not bound by the theory, we believe that a similar dissociative chemisorption occurs on the SiGe(110) surface when dosed with either $H_2O$(g) or $H_2O_2$(g) indicating that the present functionalization with $H_2O_2$ should work well on the SiGe(110) or Ge(110) surface.

Experiments also tested different dosing conditions of air exposed Ge(100) samples at 300K with low concentration $H_2O_2$(g). For dosing with 20 mTorr 2% $H_2O_2$ (g), by increasing the dosing time from 30 seconds ($6\times10^5$ L) to 45 seconds ($9\times10^5$ L), the concentration of surface oxygen has been increased to 1.5 monolayers. While increasing the dosing time of the 2% $H_2O_2$(g) increased the oxide thickness, it was still too small to remove all the carbon after annealing so the 4-5% $H_2O_2$ (g) was demonstrated to be much more effective. Experiments showed that by dosing a Ge(100) sample at 300K for 30 seconds ($1.65\times10^7$ L) with 550 mTorr 4-5% $H_2O_2$ (g), the oxygen level increased 4 fold compared to the 2% $H_2O_2$ (g) dosed surfaces, indicating successful formation of multilayers of oxide on the Ge(100) surface.

Figure 9:
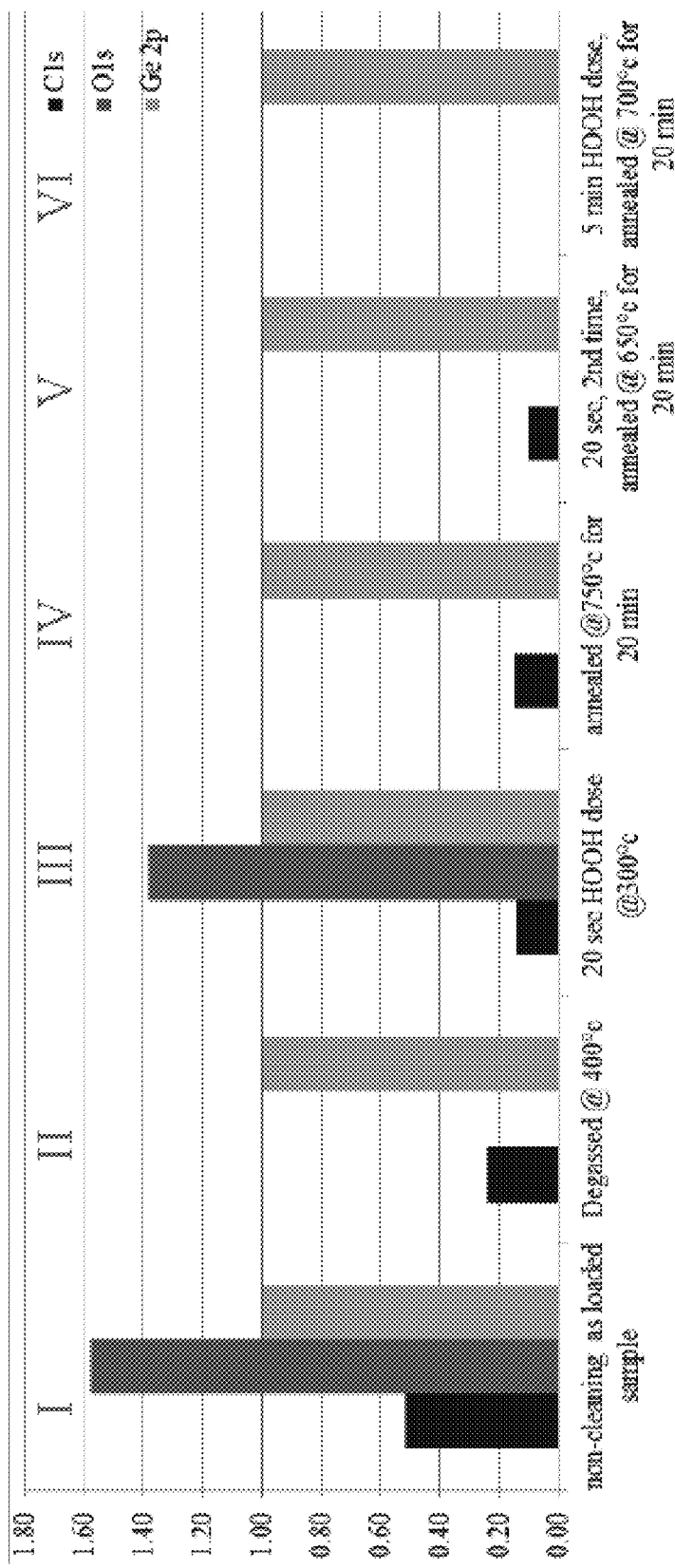
FIG. 9 is a plot of data showing results comparing multi-dose and extended single dose high concentration 4-5% $H_2O_2$(g) in-situ dry cleaning and subsequent annealing.

Experiments showed that a multilayer of the oxide formed via the 4-5% $H_2O_2$ (g) $1.65\times10^7$ L dose at a surface temperature of 300K can be removed by annealing resulting in an atomically flat surface. Surface dosing at 300K with 4-5% $H_2O_2$ (g) ($1.65\times10^7$ L) for 30 seconds and subsequent annealing at 700° C. for 30 minutes produced large terraces suitable for STM imaging, but the oxide desorption is fast as demonstrated by a brief (~60 sec) $3\times10^{-9}$ Torr pressure rise upon heating to sample to 700° C. Levels of carbon contamination from image analysis in some samples were less than 5%. Using larger doses of 4-5% $H_2O_2$ (g), carbon contamination was completely eliminated and this is verified by X-ray Photoelectron Spectroscopy. The invention thus provides atomically ordered Ge surfaces without ex-situ acid cleaning procedures or in-situ ion sputtering treatment. Contamination is reduced without any extensive ex-situ wet treatment of the surface. The process should work on all Ge reconstruction since the process only depends on local bonding properties Multi dose and single dose cleanings were also tested, and the results are shown in FIG. 9. An air exposed sample was degassed in the UHV chamber at 400° C. removing the native oxide (columns I and II). Subsequently, the sample was dosed with 4-5% $H_2O_2$ (g) for 20 seconds at 300° C. thereby reducing the carbon and growing a multi-layer non-stoichiometric germanium oxide (column III). Subsequent annealing at 750° C. removes the oxygen from the surface (column IV). The same sample was redosed for the second time with 4-5%. $H_2O_2$ (g) for 20 seconds at 300° C. and subsequently annealed for 20 min at 650° C. The carbon content reduced to half compare to previous step. (column V). An order of magnitude higher dose ($1.65\times10^8$ L) and subsequent anneal at 500° C. (the experiment used 700° C. for the purpose of obtaining better STM images) for 20 min completely removed the carbon from the surface (column VI).

To further understand the chemistry of carbon and oxygen removal from Ge at elevated temperature (300° C.), the progression of carbon and oxygen levels from its surface were analyzed with XPS, and the data are shown in FIG. 9. The XPS data has been normalized to the Ge 2p peak. The sample was first treated with acetone, methanol and HPLC water. Water treatment of the Ge surface forms a thick layer of oxide on top of the surface resulting in a very large XPS oxygen peak. The initial carbon content on the surface is ~50% (column I). Degassing at 400° C. in UHV induced all of the oxide layer to desorb along with half the carbon content leaving about 25% carbon on the Ge(100) surface (column II). This reduction in carbon content is consistent with the desorption of atmospheric hydrocarbon species which adsorbed on the oxide layer prior to loading the sample into the UHV chamber.

Degassed samples were transferred to the ALD chamber and dosed at 300° C. with 4-5% $H_2O_2$ (g) for a 20 second dose at 550 mTorr ($1.1\times10^7$ L) while maintaining sample temperature at 300° C. This produced a relatively thin oxide layer (3-10 monolayers) on the Ge surface and reduced the carbon content to about 15% (column III). A subsequent moderate temperature anneal at 750° C. desorbed all the oxygen (column IV) and pulled the surface flat. After the 750° C. anneal, bright white features were seen on STM images, which are consistent with carbon contamination due to the height of the features (5 Å) being inconsistent with Ge adatoms which have a height of 2 Å; XPS data was also consistent with carbon. It is expected that thermal anneal temperatures as low as 500° C. would be sufficient or 250° C. with atomic H.

The sample was redosed at 300° C. with 4-5% $H_2O_2$ (g) for 20 seconds at 560 mTorr ($1.1\times10^7$ L) and subsequently annealed at 650° C. It is expected that thermal anneal temperatures as low as 500° C. would be sufficient or 250° C. with atomic H. XPS data indicated that the second $H_2O_2$ dose reduced the carbon contamination of the surface to about 7% (column V). This proves that by cycling samples through $H_2O_2$(g) doses and subsequent anneals, the carbon contamination can be systematically reduced. STM images showed lower densities of white features indicating lower surface concentration of carbon than after a first $H_2O_2$ (g) dose and anneal cycle. Surfaces annealed to 650° C. and lower compared to 750° C. were still flat and free of adatoms. It is expected that thermal anneal temperatures as low as 550° C. would be sufficient or 250° C. with atomic H. The number of cycles and cycling time is not important. Instead, it is the amount of vapor which is exposed to the surface. 1 Langmuir=$10^{-6}$ torr for 1 sec. The experiments have shown that $6 \times 10^7$ Langmuirs will clean the surface of carbon contamination. This can be provided as one single dose or can be delivered over multiple pulses to the same effect.

Experiments also showed that the cyclic dose/anneal process could be replaced with a single long $H_2O_2$ (g) dose to achieved very low levels of contamination. A 5 min 4-5% $H_2O_2$ (g) dose at 550 mTorr ($165 \times 10^6$ L) at a sample temperature at 300° C. and a subsequent anneal at 700° C. (or less) for 30 minutes is sufficient to completely remove the carbon from the surface (column VI). XPS data confirmed that such a long dosing time ($165 \times 10^6$ L) of 4-5% $H_2O_2$ (g) and subsequent anneal can completely remove the carbon from the surface. It is expected that thermal anneal temperatures as low as 500° C. would be sufficient or 250° C. with atomic H.

Experiments showed that a high concentration (30% $H_2O_2/H_2O(l)$) 4-5% gas phase $H_2O_2$ source, carbon contamination can be removed from Ge(100) without wet pretreatment. Gas phase $H_2O_2$ leaves a multilayer $GeO_x$ which can be desorbed from the surface by annealing. The $H_2O_2$ (g) forms about 4 ML of $GeO_x$ which readily desorb from the surface at elevated temperature leaving an atomic ordered and clean surface.

Figure 10:
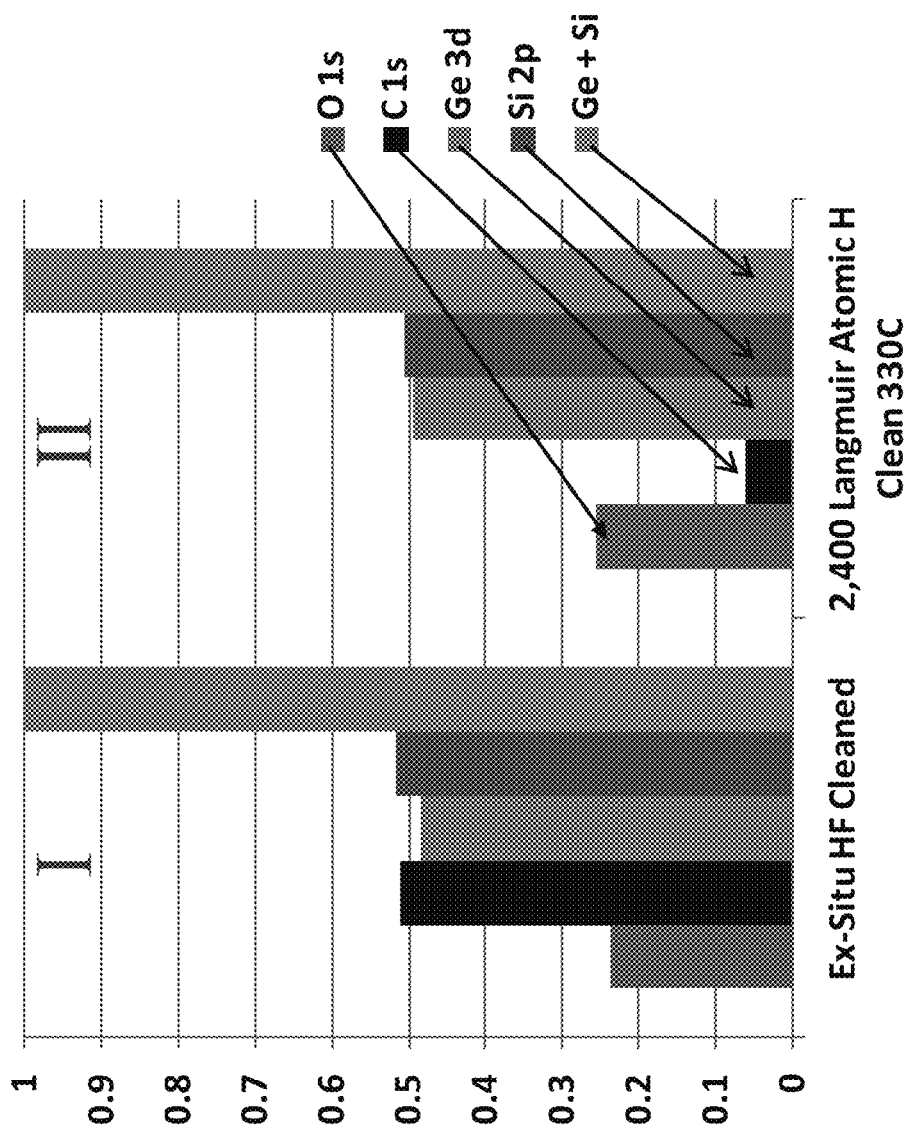
FIGS. 10 and 11 are plots that shows XPS results from preferred embodiment ex-situ wet HF cleaned SiGe(100) samples (column I) and the sample after carbon is cleaned from the SiGe surfaces (column II).

Experiments showed that an air exposed SiGe(100) wafer can be cleaned by using an ex-situ 2% $HF/H_2O$ dip for 2 minutes followed by in-situ exposure to 2400 L of atomic H can provide a nearly contaminant free sample. A wide concentration range of $HF/H_2O$ will work. FIG. 10 shows the XPS results from an ex-situ HF cleaned SiGe(100) sample (column I). After the sample is exposed to 2400 L of atomic H, the carbon contamination on the sample is reduced to 3% demonstrating that atomic H can efficiently remove carbon from the SiGe surface (column II). The residual oxygen contaminants on the surface are due to oxygen adsorption between the ex-situ HF treatment and loading the sample into vacuum. If the transfer is done in an inert environment, or if in-situ NH4F+atomic H treatment is done in-situ, there should be no residual oxygen on the surface leaving a surface clean for ALD.

Figure 11:
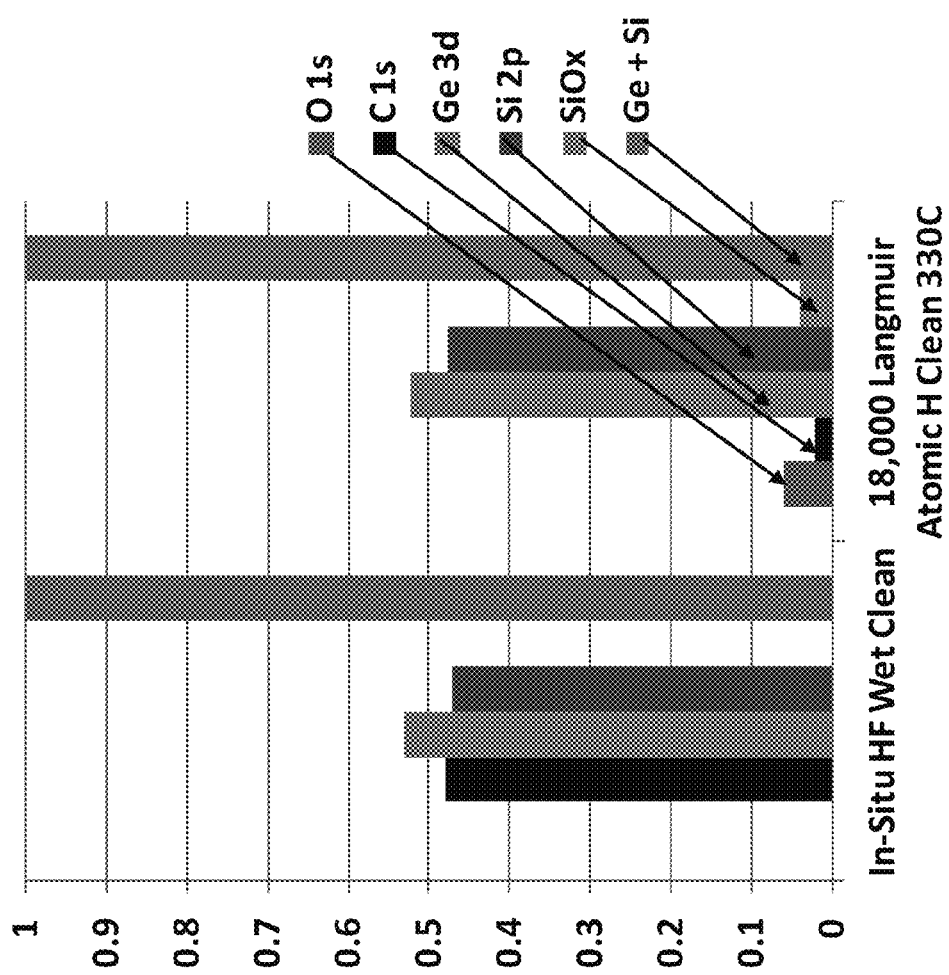

Another experiment demonstrated that maintaining the SiGe surface as if it were in an inert atmosphere could also be accomplished by leaving HF liquid on the surface. Specifically, instead of transfer in inert atmosphere, this was done by leaving liquid 2% HF in $H_2O$ on the SiGe surface until vacuum pumpdown began. The result of this cleaning method is to give a surface which is completely oxygen free. This is then followed by an in-situ 330 C atomic H treatment which removes the carbon contamination from the sample leaving a completely contaminant free sample. The results are shown in FIG. 11.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for in-situ dry cleaning of a SiGe semiconductor surface, comprising:
   dosing the SiGe surface with ex-situ wet HF in a clean ambient environment or in-situ dosing with gaseous $NH_4F$;
   dosing the SiGe surface with atomic H;
   low temperature (below ~550° C.) annealing to pull the SiGe surface flat;
   in a vacuum chamber, passivating the SiGe semiconductor surface with $H_2O_2$ vapor to form a monolayer(s) of —OH sites on the SiGe; and
   in the vacuum chamber, second annealing the SiGe semiconductor surface at a temperature below ~650° C. to avoid dopant diffusion.

2. The method of claim 1, wherein said dosing the SiGe surface comprises dosing with HF(aq).

3. The method of claim 1, wherein said dosing the SiGe surface with $NH_4$ comprises in-situ thermally mixing $NH_3$+$NF_3$ or mixing in a plasma.

4. The method of claim 1, wherein said dosing the SiGe surface with $NH_4$ comprises in-situ plasma mixing of $NF_3$ with $H_2$ or $H_2O$.

5. The method of claim 1, wherein said dosing the SiGe surface with HF comprises wet-dipping in $HF/H_2O$, followed by keeping the SiGe surface in an inert atmosphere and then followed by said dosing with the SiGe surface with atomic H, conduct in-situ.

6. The method of claim 1, wherein said low temperature annealing is conducted at or below ~350° C.

7. The method of claim 1, further comprising a preliminary step of degreasing the SiGe surface.

8. The method of claim 7, wherein the degreasing comprises sonication in acetone, methanol and high performance liquid chromatography (HPLC) water.

9. The method of claim 1, wherein the vacuum chamber comprises an atomic layer deposition (ALD) reactor.

10. The method of claim 1, wherein SiGe semiconductor surface is SiGe(110) or SiGe(100).

11. The method of claim 1, further comprising, in the vacuum chamber, providing a monolayer passivation and nucleation by depositing a monolayer of $H_2O_2$, followed by an anneal, followed by saturation with trimethylaluminum (TMA) and an anneal.

12. The method of claim 11, wherein the vacuum chamber comprises an atomic layer deposition (ALD) reactor.

13. The method of claim 1, wherein the $H_2O_2$ comprises 2% vapor $H_2O_2(g)/H_2O(g)$.

14. The method of claim 1, further comprising forming a monolayer of —OH sites with a saturation dose of $H_2O_2(g)$.

15. The method of claim 14, further comprising applying a saturation dose of trimethylaluminum (TMA) to form dimethylaluminum (DMA) bonded to the $H_2O_2(g)$ saturated SiGe semiconductor surface via an Al—O—Ge/Si bond.

16. The method of claim 14, further comprising conducting an anneal after said applying a saturation dose of trimethylaluminum (TMA) at a temperature of ~200-300° C.

* * * * *